US009823496B1

(12) United States Patent
Doerr

(10) Patent No.: US 9,823,496 B1
(45) Date of Patent: Nov. 21, 2017

(54) MODULATION-BASED INTEGRATED BROADBAND OPTICAL ISOLATOR WITH IMPROVED ISOLATION

(71) Applicant: Acacia Communications, Inc., Maynard, MA (US)

(72) Inventor: Christopher Doerr, Middleton, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 14/797,032

(22) Filed: Jul. 10, 2015

Related U.S. Application Data

(60) Provisional application No. 62/023,523, filed on Jul. 11, 2014.

(51) Int. Cl.
G02F 1/01 (2006.01)
G02F 1/017 (2006.01)
H01S 5/00 (2006.01)
G02B 6/28 (2006.01)

(52) U.S. Cl.
CPC ....... *G02F 1/01708* (2013.01); *G02B 6/2821* (2013.01); *H01S 5/0064* (2013.01)

(58) Field of Classification Search
None
See application file for complete search history.

(56) References Cited

U.S. PATENT DOCUMENTS

| 5,400,417 | A | * | 3/1995 | Allie | ..................... G02F 1/0123 359/245 |
| 5,663,824 | A | | 9/1997 | Koch et al. | |
| 6,298,177 | B1 | | 10/2001 | House | |
| 6,606,424 | B2 | | 8/2003 | Ooi et al. | |
| 6,943,931 | B1 | * | 9/2005 | Dingel | ................. G02F 1/2255 359/279 |
| 7,068,881 | B2 | | 6/2006 | Yoo | |
| 7,228,023 | B1 | | 6/2007 | Jones | |
| 8,768,110 | B2 | | 7/2014 | Doerr | |
| 2003/0058504 | A1 | * | 3/2003 | Cho | ..................... H04L 7/0075 398/147 |
| 2007/0160326 | A1 | * | 7/2007 | Kwakernaak | ...... G02B 6/12004 385/37 |

(Continued)

OTHER PUBLICATIONS

Bhandare et al., Novel Nonmagnetic 30-dB Traveling-Wave Single-Sideband Optical Isolator Integrated in Iii/V Material. IEEE J Sel Topics Quantum Electron. Mar./Apr. 2005;11(2):417-21.

(Continued)

*Primary Examiner* — Uyen Chau N Le
*Assistant Examiner* — Chad Smith
(74) *Attorney, Agent, or Firm* — Wolf, Greenfield & Sacks, P.C.

(57) ABSTRACT

An optical isolator for suppressing back reflections from a downstream optical system is described. The optical isolator includes a plurality of optical paths between a splitter and a combiner. One or more of the optical paths include two phase modulators that are driven by oscillating signals having predefined phase relationships. At least one bypass optical path does not include two phase modulators driven by oscillating signals. Amplitude and phase of an optical signal traversing the bypass optical path may be tuned to further suppress residual reflections from a downstream optical system.

22 Claims, 7 Drawing Sheets

(56) References Cited

U.S. PATENT DOCUMENTS

| | | | | |
|---|---|---|---|---|
| 2010/0014862 | A1* | 1/2010 | Suzuki | H04Q 3/00 398/79 |
| 2012/0162656 | A1* | 6/2012 | Kawanishi | G02B 6/29355 356/450 |
| 2012/0308175 | A1 | 12/2012 | Doerr | |
| 2013/0209022 | A1 | 8/2013 | Doerr et al. | |
| 2014/0334764 | A1* | 11/2014 | Galland | G02F 1/225 385/3 |
| 2014/0355925 | A1* | 12/2014 | Manouvrier | G02F 1/025 385/3 |

OTHER PUBLICATIONS

Bi et al., On-chip optical isolation in monolithically integrated non-reciprocal optical resonators. Nat Photonics. Nov. 13, 2011;5:758-62. doi: doi:10.1038/nphoton.2011.270.

Doerr et al., Optical isolator using two tandem phase modulators. Opt Lett. Nov. 1, 2011;36(21):4293-5.

Doerr et al., Silicon photonics broadband modulation-based isolator. Opt Express. Feb. 24, 2014;22(4):4493-8. doi: 10.1364/OE.22.004493.

Doerr et al., Tandem-phase-modulator-based optical isolator in silicon. 39$^{th}$ European Conference and Exhibition on Optical Communicaiton (ECOC 2013). Sep. 22-26, 2013;1-3. doi: 10.1049/cp.2013.1683.

Levy et al., Integrated Optical Isolators with Sputter-Deposited Thin-Film Magnets. IEEE Photon Tech Lett. Jul. 1996; 8(7):903-5.

Shimizu et al., Monolithic Integration of a Waveguide Optical Isolator with a Distributed Feedback Laser Diode in the 1.5μm Wavelength Range. IEEE Photon Tech Lett. Dec. 15, 2007;19(24):1973-5.

Shoji et al., Magneto-optical isolator with silicon waveguides fabricated by direct bonding. Appl Phys Lett. Feb. 21, 2008;92:071117.

Tien et al., Silicon ring isolators and bonded nonreciprocal magneto-optic garnets. Opt Express. Jun. 6, 2011;19(12):11740-5.

Yu et al., Complete optical isolation created by indirect interband photonic transitions. Nature Photon. Feb. 2009;3:91-4. doi: 10.1038/NPHOTON.2008.273.

Galland et al., Broadband on-chip optical non-reciprocity using phase modulators. Opt Express. Jun. 2013;21(12):14500-11.

U.S. Appl. No. 13/733,111, filed Jan. 2, 2013, Doerr.

U.S. Appl. No. 14/486,388, filed Sep. 15, 2014, Doerr.

* cited by examiner

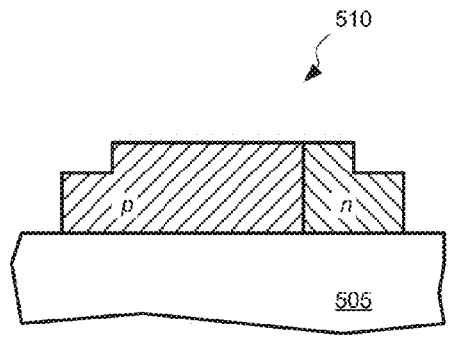
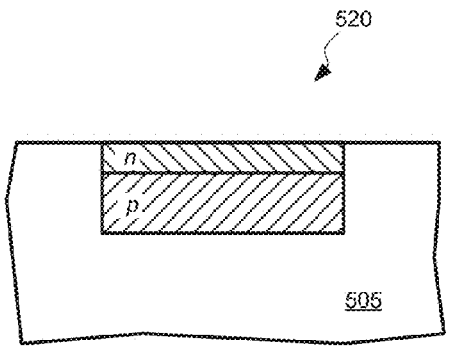
FIG. 5A    FIG. 5B
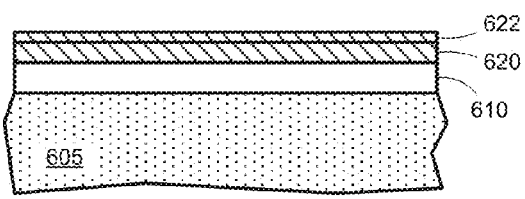
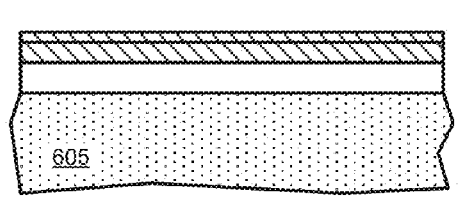
FIG. 6A-1    FIG. 6A-2
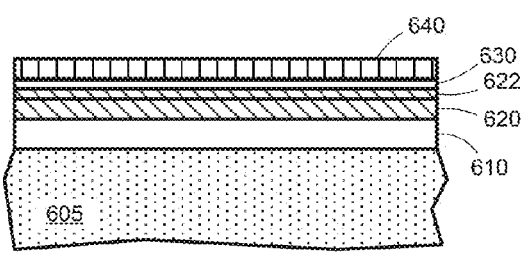
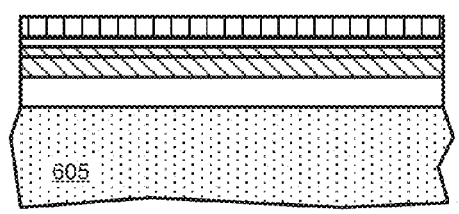
FIG. 6B-1    FIG. 6B-2

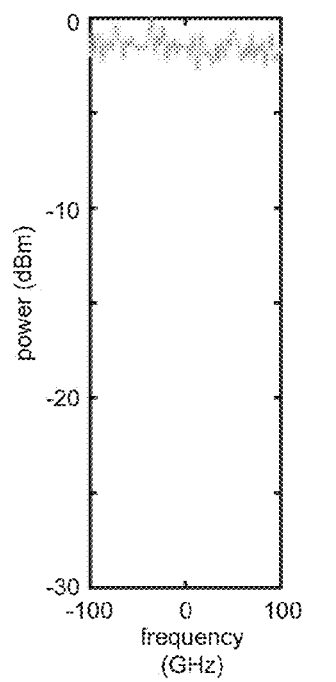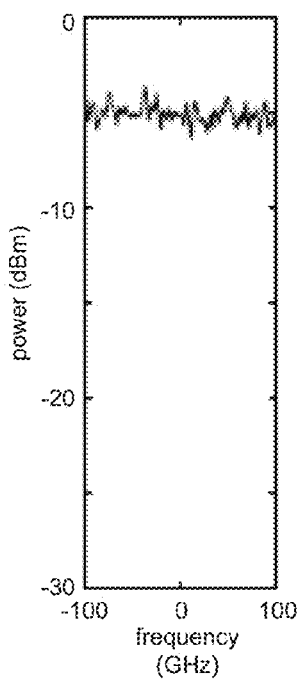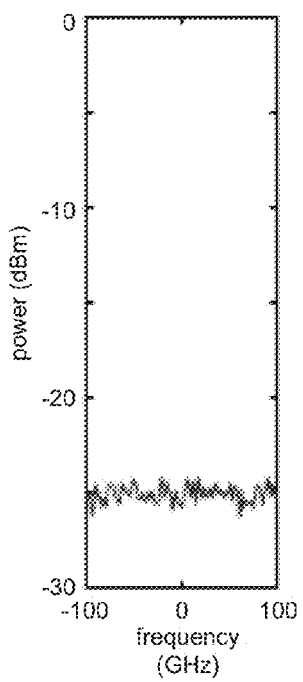
*FIG. 10A*  *FIG. 10B*  *FIG. 10C*

MODULATION-BASED INTEGRATED BROADBAND OPTICAL ISOLATOR WITH IMPROVED ISOLATION

RELATED APPLICATIONS

The present application claims the benefit under 35 U.S.C. §119(e) of U.S. Provisional Patent Application Ser. No. 62/023,523 entitled "MODULATION-BASED INTEGRATED BROADBAND OPTICAL ISOLATOR WITH IMPROVED ISOLATION," filed Jul. 11, 2014, which is incorporated herein by reference in its entirety.

BACKGROUND

Field

The present application relates to optical isolators and to optical communication systems.

Related Art

Some optical systems can be sensitive to spurious optical reflections from downstream optical components. This is often the case, for example, when a laser is used as an upstream optical source to deliver light to a downstream system. Light from the laser may travel to a downstream optical system, and a portion of the light may back-reflect from a component in the downstream system. The back-reflected light may be fed back into the laser and destabilize the laser operation. In some cases, the back-reflected light may cause amplitude and/or phase fluctuations in the laser output, which can introduce undesirable optical noise into the system. If the optical system comprises a communication link, the noise can result in bit errors.

There are several conventional techniques for optically isolating a component (such as a laser) in an optical system from potential back-reflections arising from downstream optical components. One technique, known as Faraday isolation, employs a magneto-optic polarization rotator and a pair of polarizers. Faraday isolation can require the isolator size to be large (requiring several centimeters of optical path length) to obtain the correct amount of polarization rotation between the polarizers. Faraday isolation may also require a strong magnet to be placed in close proximity to an optical path, which may not be desirable in some applications. Other conventional optical isolation techniques include electro-optic modulation techniques, but some of these systems can also require long path lengths.

BRIEF SUMMARY

The present technology relates to optical isolators and methods for operating optical isolators. According to some embodiments, an optical isolator comprises an input port coupled to a splitter and an output port coupled to a combiner. The optical isolator may further comprise N optical paths connecting the splitter and the combiner and each including two radio-frequency (RF) phase modulators, where N≥1. The optical isolator may further comprise a bypass optical path connecting the splitter and the combiner and lacking two RF phase modulators. In some embodiments, the optical path lengths of the N optical paths and the bypass optical path may be approximately the same.

Methods for operating optical isolators are also described. In some embodiments, a method to isolate an upstream optical source from an optical signal returned from a downstream optical system may comprise acts of receiving, at the optical isolator, an input optical signal from the optical source, and splitting the input optical signal into N optical paths and a bypass optical path. The method may further include modulating phases of each optical signal in the N optical paths by a first RF signal and a second RF signal, and transmitting a portion of the input optical signal from one end of the bypass optical path to an opposite end of the bypass optical path without performing radio-frequency modulation on the portion of the optical signal. The method may also include combining the optical signals from the N optical paths and the portion of the optical signal from the bypass optical path into an output signal.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 5A depicts a photonic integrated waveguide for a phase modulator that may reduce amplitude modulation, according to some embodiments.

FIG. 5B depicts a photonic integrated waveguide for a phase modulator that may reduce amplitude modulation, according to some embodiments.

FIGS. 6A-1, 6B-1, 6C-1, 6D-1, 6E-1 and FIG. 6F-1 depict structures associated with a method for fabricating an integrated photonic phase modulator, according to some embodiments.

FIGS. 6A-2, 6B-2, 6C-2, 6D-2, 6E-2 and 6F-2 depict structures associated with a waveguide region adjacent to an integrated photonic phase modulator, according to some embodiments.

FIG. 10A, FIG. 10B, and FIG. 10C illustrate incident power, transmitted power, and reflected power, respectively, for an optical isolator, according to another embodiment.

DETAILED DESCRIPTION

The present technology pertains to electro-optic-based, optical isolation. Aspects of the present application provide apparatus and methods to improve electro-optic isolation techniques. According to an aspect of the present application, an optical isolator includes multiple, parallel optical paths interconnecting a splitter and a combiner. At least one, and in some embodiments all but one, of the optical paths includes multiple radio-frequency (RF) phase modulators. One of the optical paths (referred to as a "bypass" optical path) interconnecting the splitter and the combiner does not include an RF modulator, or does not include an RF modulator that is activated during operation of the isolator to modulate the phase of a signal at RF frequencies in the bypass optical path. An optical signal traversing the bypass optical path may be adjusted to cancel optical signals reflected along the other optical paths interconnecting the splitter and the combiner. Such an optical isolator can better suppress back-reflections from downstream optical components compared to conventional electro-optic isolators, and can be compact in size. In some cases, an optical isolator of the types described herein may be incorporated in a photonic integrated circuit (PIC).

The aspects and embodiments described above, as well as additional aspects and embodiments, are described further below. These aspects and/or embodiments may be used individually, all together, or in any combination of two or more, as the application is not limited in this respect.

Figure 1:
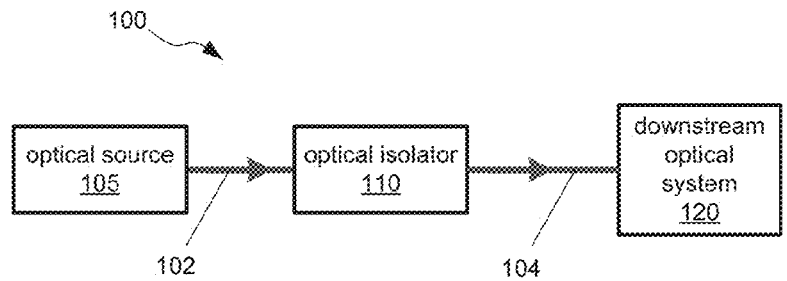
FIG. 1 depicts an optical system in which an optical isolator may be implemented, according to some embodiments.

FIG. 1 illustrates an optical system according to an embodiment of the present application. The optical system 100 may include an optical source 105, an optical isolator 110, a downstream optical system 120, an optical link 102 connecting the optical source 105 to the optical isolator 110, and an optical link 104 connecting the optical isolator 110 to the downstream optical system 120.

The optical system 100 is a non-limiting example of an optical system to which aspects of the present application may apply. For example, the optical system may comprise an optical communication network that includes signal modulators and optical receivers distributed in a network of optical links. There may, or may not, be additional optical elements upstream of the optical source 105. Downstream of the optical isolator 110 there may be one or more modulators for encoding information onto an optical carrier wave. In some embodiments, there may be a fiber plant downstream of the optical source, which can produce fiber backscatter and reflections from optical connectors. In some implementations, the optical system may comprise an optical sensing system that includes a laser as the optical source 105 and one or more detectors in the downstream optical system 120. In some cases, the optical system 100 may comprise a PIC that is fabricated onto a single chip. The optical source may, or may not, be modulated, so that the output provided to the optical isolator 110 may, or may not, be modulated.

The optical source 105 may be a laser, an optical amplifier, a resonator or resonant cavity device, a modulator, or other suitable optical source. According to some embodiments, the optical source 105 may comprise a laser and/or an optical amplifier located on a PIC that is designed for an optical communication system (e.g., as part of an optical signal modulator, decoder, receiver, transmitter, transceiver, router, relay, etc.). The laser or amplifier may comprise semiconductor devices (e.g., indium-phosphide-based lasers or semiconductor optical amplifiers).

The optical links 102 and 104 may comprise a free-space optical path, a fiber-optic link, optical connectors, a photonic waveguide, a system of relay lenses and/or mirrors, or a combination thereof.

The optical isolator 110 may allow transmission of an optical signal from the optical source 105 to the downstream optical system 120, but block or strongly attenuate reflection or transmission of an optical signal from the downstream optical system 120 to the optical source 105. The optical isolator 110 may comprise an optical assembly in which an input signal is split into a plurality of optical paths, examples of which are depicted and described further below in connection with FIG. 2 and FIG. 7. Some of the optical paths include tandem radio-frequency (RF) phase modulators that phase shift the optical signal in the path in which the phase modulators are disposed. The phase modulators are tandem in that they are arranged serially along the optical path. The phase modulators within an optical path may be separated by a predetermined distance L. The action of the phase modulators and the separation distance L allows light to pass from the input of the isolator 110 to the output with low loss, but strongly attenuates light traveling from the output to the input of the isolator 110.

Because the RF phase modulators may impart amplitude modulation (referred to as "residual amplitude modulation") to the optical signals as well as phase shifts, the amount of attenuation for backward propagating light may be compromised. A bypass optical path, illustrated in FIGS. 2 and 7 as bypass optical path 260, is included to cancel backward propagating light due to residual amplitude modulation.

The optical isolator 110 may assume any suitable form for performing the described operation. In some embodiments, the optical isolator 110 may comprise microfabricated semiconductor optical waveguides and electro-optic phase modulators. In some implementations, an optical isolator may comprise a fiber-optic assembly with fiber-optic-compatible, electro-optic phase modulators.

Figure 2:
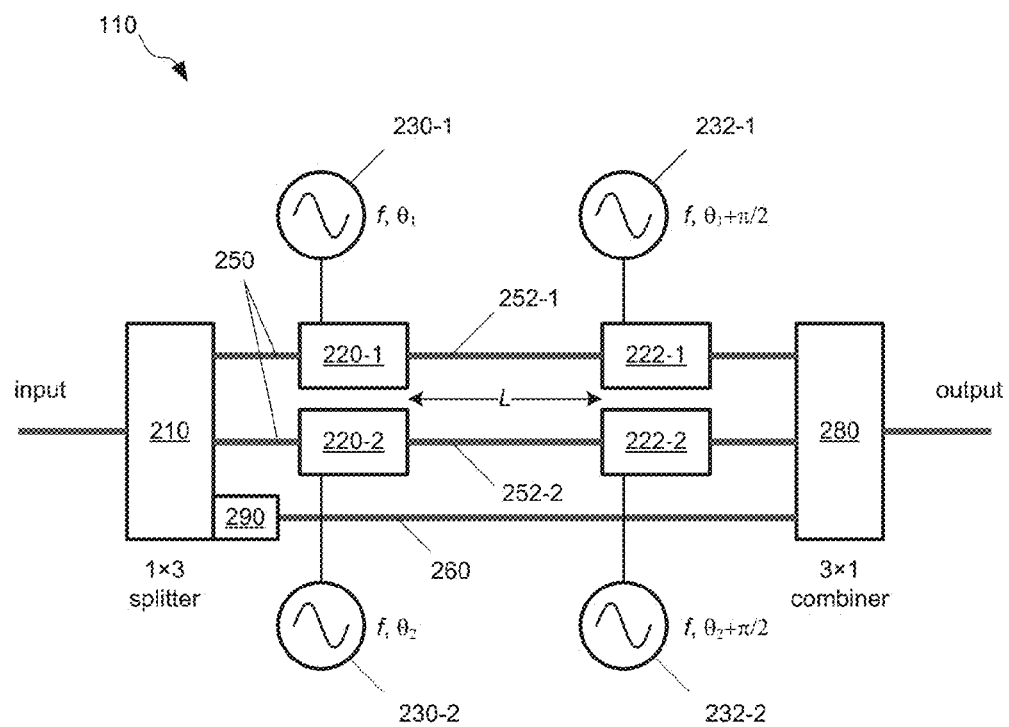
FIG. 2 depicts an optical isolator having three optical paths between a splitter and a combiner, according to some embodiments.
Figure 7:
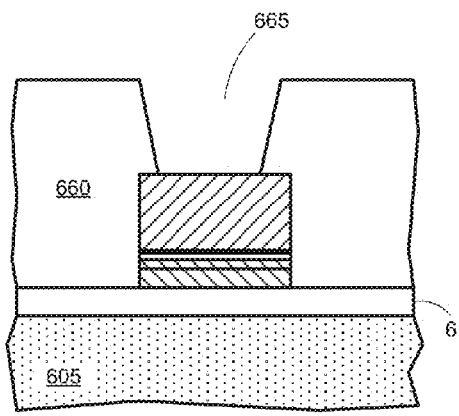
FIG. 7 depicts an optical isolator having (N+1) optical paths between a splitter and a combiner, according to some embodiments.
Figure 7:
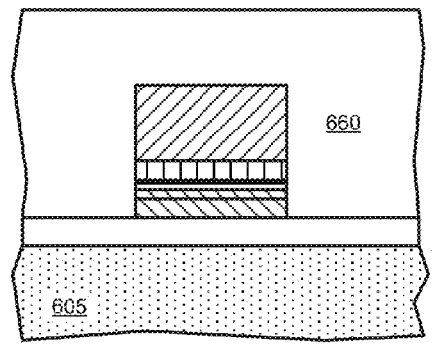
Figure 7:
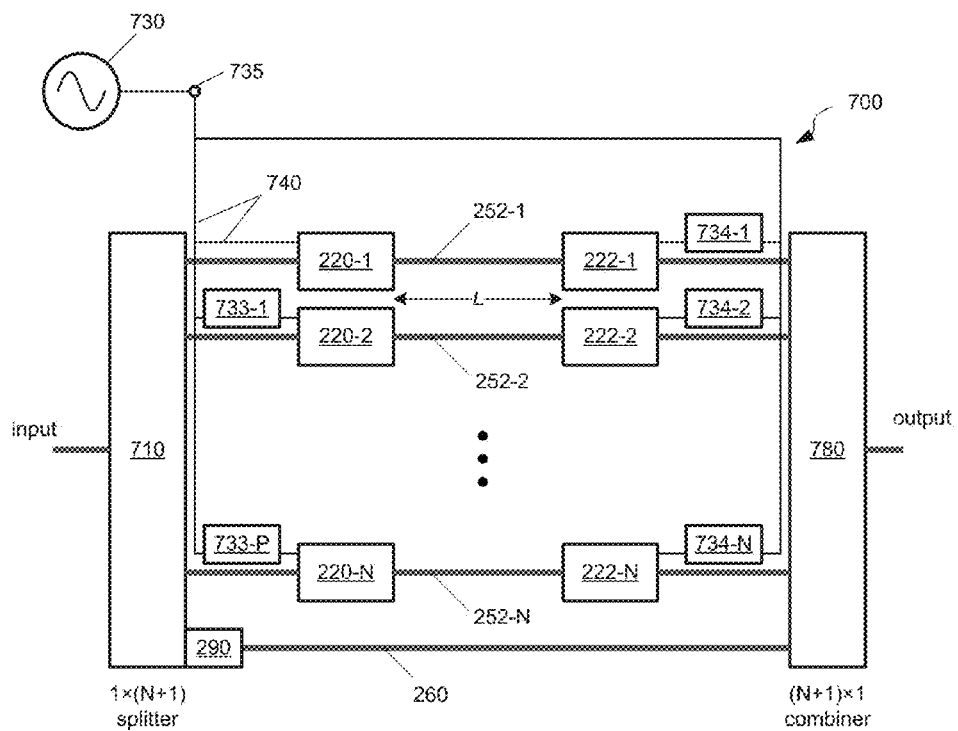

An embodiment of the optical isolator 110 is depicted in FIG. 2. The optical isolator 110 may comprise an input port connected to a splitter 210 and an output port connected to a combiner 280. There may be a plurality of optical paths 250 and 260 connecting output ports from the splitter 210 to input ports of the combiner 280. In the non-limiting example of FIG. 2, there are two optical paths 250 and a single optical path 260. FIG. 7 illustrates an alternative. The optical paths 250 and 260 may comprise free-space optical paths, fiber-optic links, photonic waveguides, a system of relay lenses and/or mirrors, or a combination thereof.

The optical path lengths through each optical path 250, 260 may be approximately equal to provide a wide wavelength range of optical isolation. When implemented in a PIC, the optical paths 250, 260 comprise integrated photonic waveguides (e.g., Si waveguides and/or InP-based waveguides). The waveguides may be single-mode waveguides, and may preserve polarization of the optical signal traversing the waveguides. In some embodiments, the optical isolator 110 may be fabricated on a silicon-on-insulator or semiconductor-on-insulator (SOI) wafer, and the photonic waveguides may have transverse dimensions between about 100 nm and about 2 microns. An overall path length of the optical isolator 110, when implemented on a PIC, may be between approximately 1 mm and approximately 10 mm.

The optical paths 250 may include pairs of tandem RF phase modulators. For instance, in the non-limiting example of FIG. 2, a first optical path 250 of the optical isolator 110 includes a first phase modulator 220-1 and a second phase modulator 222-1. A second optical path 250 includes a first phase modulator 220-2 and a second phase modulator 222-2. The tandem phase modulators may be driven by RF signals having a selected amplitude and phase relationship to modulate the phase of an optical signal traversing the optical path by a predetermined amount. The RF signal may have a frequency f between about 1 GHz and about 50 GHz, according to some embodiments. In some cases, a lower RF frequency (e.g., down to about 100 MHz) may be used for larger optical isolators, such as isolators assembled from fiber optic components.

An optical isolator according to embodiments of the present application, such as optical isolator 110, may, or may not, include one or more RF sources. For example, in FIG. 2 the optical isolator 110 includes four RF sources, 230-1 and 232-1 for a first optical path 250, and 230-2 and 232-2 for a second optical path 250. Any such RF sources may be located on a same chip as the optical isolator, or may be located off chip. In some implementations, the RF sources may comprise ring oscillators fabricated on chip using complementary metal oxide semiconductor (CMOS) circuitry. In some embodiments, the RF sources may comprise crystal oscillators. Although four different RF sources are shown in FIG. 2, a single RF source may be used to drive all of the phase modulators with different phase shifts in some embodiments. In some implementations, an optical isolator may include one or more RF terminals for connecting to an external RF source. In some implementations, a same RF frequency f is used to drive all of the RF phase modulators in the optical isolator 110.

The amplitudes of the oscillating signals provided to each RF phase modulator may be the same, in some cases, if the phase modulators exhibit a same response to the RF drive signal (e.g., produce a same amount of phase shift of the optical signal for a same amount of RF drive signal). If the RF phase modulators exhibit different responses to the RF drive signals, the optical isolator may further include variable RF attenuators and/or amplifiers or variable RF sources, so that amplitudes of RF drive signals delivered to one or more RF phase modulators 220-1, 220-2 . . . 220N (see FIG. 7 also), and 222-1, 222-2 . . . 222-N (see FIG. 7 also) can be varied independently.

The tandem phase modulators in each optical path including such modulators may be separated by a distance L over an intermediate optical link, illustrated as 252-1 and 252-2 in FIG. 2. This separation distance in each intermediate optical path 252-1 and 252-2 may be related to the RF drive frequency f used to operate the RF phase modulators 220-1, 220-2, 222-1 and 222-2 and a group velocity $v_g$ of the intermediate optical path. For example, the distance L may be determined by the following expression:

$$L = \frac{v_g}{4f} \quad (1)$$

When the intermediate optical paths 252-1 and 252-2 comprise fiber-optic or photonic waveguides, the group velocity $v_g$ can be determined from the waveguide group velocity for the particular fiber or waveguide and for a characteristic wavelength of the optical signal traversing the isolator 110. For optical communications, the characteristic wavelength may be between approximately 1200 nm and approximately 1700 nm, including any value or range of values within that range.

In operation, each RF phase modulator 220-1, 220-2, 222-1, and 222-2 in the optical isolator 110 is driven with an RF signal having a selected amplitude and phase. The amplitude and phase are selected so that each phase modulator 220-1, 220-2, 222-1, and 222-2 imparts a phase shift of approximately $0.77\pi$ (peak-to-peak) to an optical signal traversing each phase modulator. In practice, the RF amplitude may be increased until a minimum amount of backward travelling signal is measured. Additionally, the phases of the RF signals are skewed between the first and second RF modulators in a tandem pair, and between the different optical paths. For example a second phase modulator 222-1 in a tandem pair may receive an RF drive-signal having a phase ($\phi=\theta_1+\pi/2$) that lags the phase $\theta 1$ of the drive signal for the first phase modulator 220-1 by essentially 90°. Additionally, a first RF phase modulator 220-1 in a first optical path may receive an RF drive-signal phase $\theta_1$ that is different from an RF drive-signal phase $\theta_2$ for a first phase modulator 220-2 in a second optical path. In some embodiments when two optical paths with tandem RF phase modulators are used, the relative phases ($\theta_2-\theta_1$) of the drive signals received by the first RF phase modulators 220-1, 220-2 may be essentially 180°.

As a non-limiting example of RF drive signals for the RF phase modulators, a first RF phase modulator 220-1 in a first optical path may receive a first drive signal represented by $RF_1=A \cos(2\pi ft)$, in which A is the amplitude of the signal, f is the frequency of the signal, and t represents time. A second RF phase modulator 222-1 in the first optical path may receive a second drive signal represented by $RF_2=A \sin(2\pi ft)$. A first RF phase modulator 220-2 in a second optical path may receive a third drive signal represented by $RF_3=-A \cos(2\pi ft)$, and a second RF phase modulator 222-2 in the second optical path may receive a fourth drive signal represented by $RF_4=-A \sin(2\pi ft)$.

Optical isolation for this example can be understood in part by considering the action of the RF phase modulators on an optical signal traversing the first optical path. When an optical signal travels from input to output, the action of the tandem RF phase modulators is to multiply the field substantially by the following expression $$e^{jA \cos(2\pi ft)} e^{jA \sin [2\pi f(t-\Delta T)]} \quad (2)$$

wherein A is an amplitude of the phase modulation and $\Delta T=L/v_g$. When L is given by EQ. 1 and assuming the RF modulators are linear, then the expression in EQ. 2 is equal to 1. That is, the RF modulators have no effect on a forward-traveling signal. When an optical signal travels from the output toward the input in FIG. 2, the action of the tandem RF phase modulators is given substantially by the following expression $$e^{jA \sin(2\pi ft)} e^{jA \cos [2\pi f(t-\Delta T)]} \quad (3)$$

which is equivalent to $$e^{j2A \sin(2\pi ft)} \quad (3)$$

when L is given by EQ. 1.

The amplitude of the nth line of the Fourier transform of EQ. 3 is the nth Bessel function of 2A, twice the phase modulation amplitude. To optically isolate a continuous wave optical signal, the $0^{th}$ line of the Fourier transform should be equal to zero. The $0^{th}$ line of the Fourier transform represents signal power at DC. To satisfy this condition, $$J_0(2A)=0 \quad (4)$$

where $J_0$ denotes the zeroth Bessel function. EQ. 4 will be satisfied when A=1.2, which implies that each RF phase modulator should impart essentially a $0.77\pi$ phase shift (peak-to-peak).

Although the reverse traveling signal is blocked at DC for the first optical path, the optical power is spread into sidebands that are spaced at integer multiples of the RF frequency f if only the first optical path were used. By adding additional optical paths with tandem RF phase modulators having their RF drive signals phased differently, the sidebands can be suppressed.

As shown in FIG. 2, at least one of the optical paths (e.g., a bypass optical path) connecting the splitter 210 and the combiner 280 may not include active tandem RF phase modulators that modulate the phase of an optical signal at RF frequencies that are applied to the tandem RF phase modulators in the other optical paths. In some instances, the bypass optical path may not include any RF phase modulator at all. Instead, this bypass optical path 260 may include a single phase modulator and/or amplitude modulator 290. The modulator 290 may be biased by a low, non-RF frequency or DC bias source to adjust the phase and/or amplitude of optical signals traversing the bypass optical path 260. Thus, it should be appreciated from FIG. 2 that in some embodiments an optical isolator comprises a plurality of parallel optical paths between a splitter and a combiner, all but one of which include tandem RF modulators, with the remaining optical path including no RF modulator.

The inventor has recognized and appreciated that tandem phase modulators 220-1, 220-2 . . . 220-N and 222-1, 222-2 . . . 222-N do not only modulate the phase of optical signals traversing the modulators. For integrated silicon photonics, a phase modulator may operate by current injection into a region of a semiconductor. The change in carrier density can change the refractive index of the region according to the Kramers-Kronig relations. The change to the refractive index is to both its real and imaginary parts. Changes to the imaginary part of the refractive index affect absorption of the region. Therefore, the RF phase modulators can also impart amplitude modulation (referred to as "residual amplitude modulation") to the optical signals. As the injected carrier density increases, the ratio of change of the imaginary part of the refractive index to the real part increases. The resulting residual amplitude modulation degrades the performance of the optical isolator, allowing more light to travel back through the isolator than would occur if there were no residual amplitude modulation.

To counter the effect of residual amplitude modulation, at least one bypass optical path 260 may be added to the optical isolator 110. The bypass optical path 260 may include a DC or low-speed phase modulator and/or amplitude modulator 290. The bypass optical path 260 may allow a small amount of back-reflected optical field to return to the splitter 210 and coherently interfere with and cancel an aggregate optical signal returning through the optical paths 250 that is due to the residual amplitude modulation. The modulator 290 may include one or more electrical terminals to receive at least one bias signal. The at least one bias signal may be applied to adjust the phase and/or amplitude of an optical signal in the bypass optical path 260 to improve cancellation of backward travelling light.

According to some embodiments, the bypass optical path has an optical path length between the splitter 210 and combiner 280 that is approximately equal to the optical path lengths of the other N optical paths between the splitter and combiner. By keeping the optical path lengths between the splitter and combiner nearly equal, optical interference will occur between the different paths so that back-reflected light can be cancelled over a wide wavelength range. In practice, the optical path lengths may differ, but may be within the temporal coherence length of the optical radiation that is being isolated.

Figure 3:
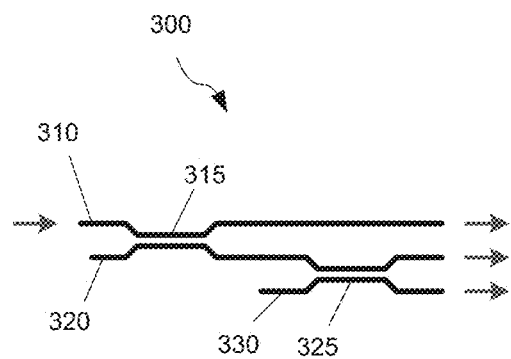
FIG. 3 depicts an example of an optical splitter, according to some embodiments.

Further details of an optical isolator 110 will now be described. According to some embodiments, a splitter 210 may comprise an optical fiber splitter or an integrated optical waveguide splitter. One example of an integrated optical waveguide splitter 300 is depicted in FIG. 3, though other splitter designs may be used. In some embodiments, an integrated optical waveguide splitter may comprise a plurality of microfabricated waveguides 310, 320, 330 on a substrate that include waveguide coupling regions 315, 325. The waveguides may be semiconductor-based waveguides as described above. The coupling regions may be regions where two or more waveguides are spaced near each other so that at least an evanescent field from one waveguide extends into at least one adjacent waveguide.

An optical signal may be coupled into a first waveguide 310 and proceed to a first coupling region 315 where a first portion of the optical signal will couple to a second waveguide 320. The first portion of optical signal coupled into the second waveguide 320 may proceed to a second coupling region 325 where a third portion of the optical signal may couple to a third waveguide 330. In some implementations, the coupling regions may be designed such that an equal amount of power is provided from three exit ports of the splitter 210. For example, in the first coupling region 315 approximately ⅔ of the input optical power may couple into the second waveguide 320. At the second coupling region 325, approximately ½ of the optical power in the second waveguide 320 may couple to the third waveguide 330. Other coupling ratios may be used in other embodiments.

In some embodiments, a splitter 210 may comprise an optical star coupler in which a single input waveguide excites a slab waveguide region which couples to two or more output waveguides. The geometry of the slab waveguide region may be designed to provide approximately equal amounts of power to the output waveguides from the splitter.

According to some embodiments, a combiner 280 may also comprise integrated optical waveguides. In some cases, a combiner may comprise a splitter 210 operated in reverse. A splitter 210 and a combiner 280 may be fabricated on a same photonics integrated circuit as an optical source 105, according to some embodiments. Waveguides for the splitter 210 and combiner 280 may be fabricated in silicon or any other suitable material for a photonics integrated circuit. For example, the waveguides may be fabricated in indium phosphide or other III-V materials.

Figure 4A:
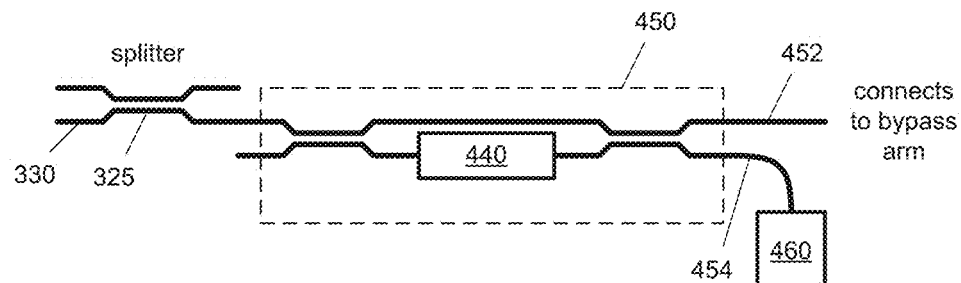
FIG. 4A depicts a phase modulator that may be included in a bypass optical path of an optical isolator, according to some embodiments.

As noted above, a bypass optical path 260 in an optical isolator 110 may include an amplitude modulator and/or a phase modulator 290. FIG. 4A depicts one example of an amplitude modulator that may be included in a bypass optical path 260, for example as modulator 290. In this example, an amplitude modulator comprises a Mach-Zehnder interferometer 450 fabricated from integrated optical waveguides or optical fibers. A Mach-Zehnder interferometer may include a phase modulator 440 in one arm of the interferometer. By changing the phase in one arm, an output power from a first output port 452 of the interferometer may be adjusted. The first output port may connect to the bypass optical path 260. Power exiting from a second output port 454 of the interferometer may be directed to an absorbing region 460 on a substrate, or to an optical absorber if optical fibers are used for the isolator 110.

According to some embodiments, the phase modulator 440 may be a thermo-optic phase shifter, as described by M. R. Watts et al., in "Adiabatic Thermo-Optic Mach-Zehnder Switch," *Opt. Lett.* Vol. 38, No. 5, 733-735 (2013), which is incorporated herein by reference. Such thermo-optic phase modulators can achieve efficient optical phase modulation of up to $2\pi$ in a length of waveguide less than 20 microns. In other embodiments, the phase modulator 440 may comprise a semiconductor-based phase modulator that alters phase by current injection into a waveguide. For an optical fiber Mach-Zehnder interferometer, the phase modulator may comprise piezoelectric material that stretches a length of fiber in one arm of the interferometer. Regardless of the type of phase modulator 440, it may be controlled by a DC bias to adjust and set the phase of an optical signal traversing one arm of the interferometer 450, so that a desired amplitude from the first port 452 of the interferometer is obtained.

In some implementations, an amplitude modulator may comprise a length of semiconductor material (e.g., a length of semiconductor waveguide) into which carriers may be injected. For example, the waveguide may include a p-n junction containing multiple quantum wells (MQWs). Carriers injected into the junction can alter the imaginary part of the optical refractive index, as described above, and affect the waveguide loss. According to some embodiments, the region in which amplitude of the optical signal is modulated may be predominantly n-type semiconductor material, because of the electrons' greater effect on the imaginary refractive index than holes.

Figure 4B:
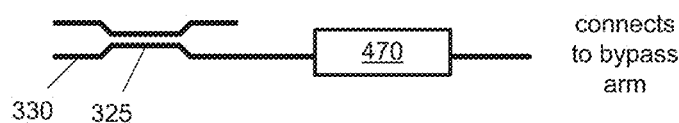
FIG. 4B depicts an amplitude modulator that may be included in a bypass optical path of an optical isolator, according to some embodiments.

In addition to adjusting the amplitude of a signal in the bypass optical path 260, it may be desirable, and necessary in some embodiments, to adjust and set the phase of the signal independently of the amplitude. By adjusting the amplitude and phase of the optical signal in the bypass optical path 260, the amount of backward-travelling light through the optical isolator 110 can be reduced. A phase modulator may be placed directly in the optical bypass path 260, as depicted in FIG. 4B, and may be located before or after the amplitude modulator. According to some embodiments, a phase modulator 470 may be a thermo-optic phase shifter. In other embodiments, the phase modulator 470 may comprise a semiconductor-based phase modulator that alters phase by current injection into a waveguide. In some cases, phase modulator 470 may have a same structure as RF phase modulators 220-1 and 222-1, but be operated at DC or low speed (non-RF). In some implementations, the RF phase modulators, phase modulator 440, and phase modulator 470 may all have the same structure.

In practice, an amplitude and/or phase of an optical signal in the bypass optical path 260 may be set dynamically. For example, an amount of power reflected back through an optical isolator 110 may be monitored by an upstream photodetector (not shown) or other sensor. Control signals may be provided to the modulator 290 to adjust the amplitude and/or phase of an optical signal in the bypass optical path 260 to reduce or minimize an amount of back-reflected power. The phase and/or amplitude adjustment may be made through manual operation of the control signals, in some cases. In some embodiments, the phase and/or amplitude adjustment may be made automatically through a feedback control circuit or any other suitable control circuit that provides phase and/or amplitude adjusting control signals responsive to an amount of detected back-reflected optical signal.

Any or all of the RF phase modulators and phase modulator(s) of the bypass optical path 260 may be implemented as a semiconductor-based, electro-optic phase modulator. Such a phase modulator may be formed in a waveguide and include a p-n or p-i-n junction, and may, or may not, include MQWs. A semiconductor-based, electro-optic phase modulator may be oriented as a lateral junction 510, depicted in FIG. 5A, or as a vertical junction 520, depicted in FIG. 5B. The inventor has recognized and appreciated that the amount of residual amplitude modulation imparted by a phase modulator can be reduced by employing injection of holes into a phase modulator rather than electrons. Therefore, a phase modulator may comprise an asymmetric lateral junction 510, depicted in FIG. 5A, or an asymmetric vertical junction 520, depicted in FIG. 5B, in which a larger portion of an optical mode travelling through the phase modulator may be guided mainly within a p-doped region of the phase modulator or a region of the junction into which predominantly holes are injected. In some embodiments, the junctions 510 or 520 may not be asymmetric.

According to some embodiments, a junction, such as 510 or 520, of a phase modulator may be formed on a substrate that includes a PIC. In some implementations, a phase modulator junction may be formed on an insulating or low-refractive-index layer 505 on a substrate. For example, the junction 510 may be formed on an oxide layer of a semiconductor-on-insulator (SOI) wafer. FIGS. 6A-1, 6B-1, 6C-1, 6D-1, 6E-1, and 6F-1 depict structures associated with a method to fabricate an integrated photonic phase modulator in a waveguide structure, according to one embodiment. FIGS. 6A-2, 6B-2, 6C-2, 6D-2, 6E-2, and 6F-2 depict structures associated with an adjacent region of a waveguide into which a phase modulator is fabricated. Although the fabrication process is described for an InP semiconductor system, it may also be implemented in a Si semiconductor system or other semiconductor systems. For example, the optical isolator may be fabricated on a silicon photonics chip in some embodiments.

Fabrication of a phase modulator may begin with forming a buffer layer 622 on a substrate. The region shown in FIG. 6A-1 corresponds to a region of a substrate where a phase modulator will be fabricated, and the region shown in FIG. 6A-2 corresponds to a region of a substrate adjacent the phase modulator (e.g., a region where a waveguide may be fabricated to carry an optical signal to or from the phase modulator). Thus, FIGS. 6A-1, 6B-1, 6C-1, 6D-1, 6E-1, 6F-1 illustrate a fabrication sequence with respect to a first region and FIGS. 6A-2, 6B-2, 6C-2, 6D-2, 6E-2, and 6F-2 illustrate a fabrication sequence with respect to a second region adjacent the first region. The substrate may comprise an n-type InP layer 620 on an insulator layer 610 (e.g., an oxide such as $SiO_2$) on a bulk semiconductor substrate 605, in some embodiments. The buffer layer 622 may comprise n-type InP and may be between approximately 5 nm and approximately 50 nm thick. The n-type InP layer 620 may be between 50 nm and one micron thick. The buffer layer 622 and doped layer 620 may be epitaxially grown by metal-organic chemical-vapor deposition (MOCVD). In some embodiments, the buffer layer may be formed by atomic layer deposition (ALD). Other doped semiconductor material and other thicknesses may be used in other embodiments.

In subsequent processing steps, MQWs 630 may be formed over the buffer layer, and an intrinsic layer 640 (e.g., intrinsic InP) deposited over the MQWs, as depicted in FIG. 6B-1 and FIG. 6B-2. The MQWs may comprise alternating layers of InP and an alloy of InP (e.g., InGaP), according to some embodiments. There may be between 5 and 50 MQWs. Each layer of InP may be less than about 10 nm. The intrinsic layer 640 may be between 100 nm and 500 nm thick. In some embodiments, the intrinsic layer is approximately 250 nm thick. The MQWs and intrinsic layer may be epitaxially grown by MOCVD. In some embodiments, the MQWs may be formed by ALD. Other layer thicknesses may be used in other embodiments.

Figures 1, 6C:
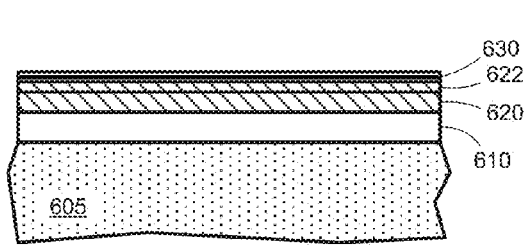
Figures 2, 6C:
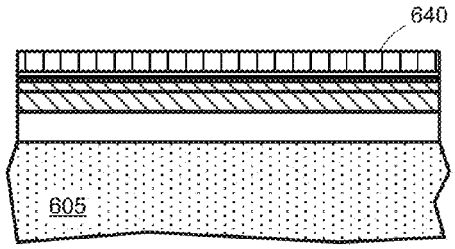

The intrinsic layer 640 may be etched from a region where a phase modulator will be formed, as depicted in FIG. 6C-1. The intrinsic layer may be removed using photolithography to pattern a resist and reactive ion etching (RIE) to etch away the intrinsic layer 640. The etching may be selective to the intrinsic layer material and stop on a layer of the MQW, according to some embodiments.

Figures 1, 6D:
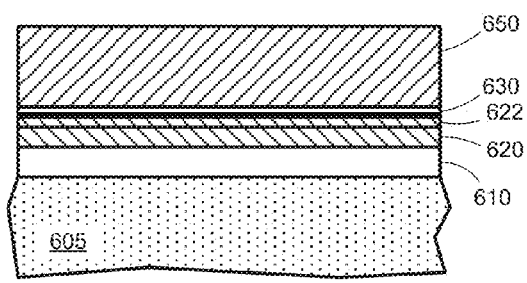
Figures 2, 6D:
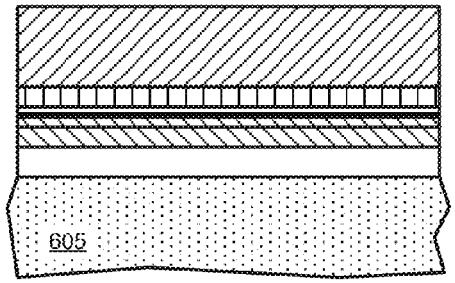
Figures 1, 6E:
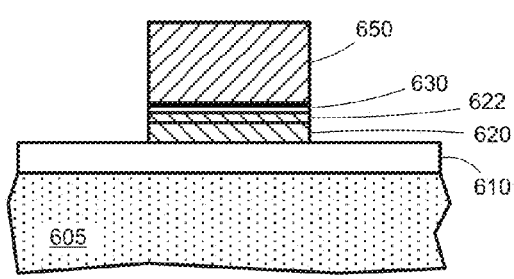
Figures 2, 6E:
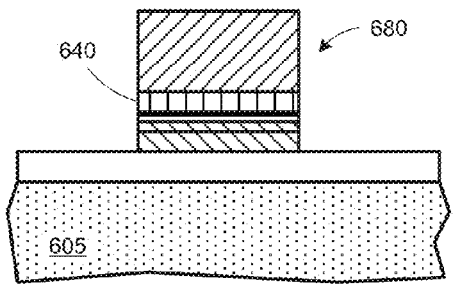

A p-doped layer 650 may then be formed over the substrate, as depicted in FIG. 6D-1 and FIG. 6D-2. The p-doped layer may comprise InP, and may be between approximately 1 micron and 2 microns thick. According to some embodiments, the p-doped layer 650 may be approximately 1.7 microns thick. A photolithography process may then be used to form waveguide structures at the phase modulator region, as depicted in FIG. 6E-1, and in regions adjacent the phase modulator, as depicted in FIG. 6E-2. For example, a resist may be deposited and photolithographically patterned to define waveguide paths on the wafer. The regions adjacent the waveguides may then be etched away using RIE. The etch may be anisotropic to produce vertical waveguide walls 680. The waveguide structures may be between approximately 300 nm and 2 microns in width, and may have a vertical height between approximately 200 nm and approximately 3 microns in height.

In a subsequent step, a passivating layer 660 may be deposited over the waveguides, as depicted in FIGS. 6F-1 and 6F-2. The passivating layer may comprise oxide in some embodiments. The passivating layer may have a refractive index lower than the semiconductor material in which the waveguides are formed, and may exhibit low loss to the optical signal carried by the waveguides. The passivating layer may be deposited by any suitable process, which may include chemical vapor deposition processes or physical deposition processes. In some implementations, the passivating layer may be annealed after deposition. Subsequently, a via 665 may be opened in the passivating layer 660 as shown in FIG. 6F-1 using any suitable lithography process. The via allows for an electrical contact (e.g., by deposition and patterning of a metal layer) to be made to the p-side of the phase modulator.

Referring again to FIG. 2, an optical isolator 110 may have fewer or more optical paths between the splitter 210 and the combiner 280 than are depicted in the illustration. For example some embodiments may include a single optical path 250 and a bypass optical path 260 between the splitter and the combiner. As depicted in FIG. 7, an optical isolator 700 may comprise N optical paths and a bypass optical path 260 extending between a 1×(N+1) splitter 710 and a (N+1)×1 combiner 780, according to some implementations. The optical isolator may act as an interferometer having N+1 arms into which an input optical signal is split and coherently recombined. The optical path length through each arm may be approximately equal. The isolator 700 may include a single input port coupled to the splitter and a single output port coupled to the combiner.

In some embodiments there may be a single RF source 730 that provides an oscillating signal to drive the phase modulators in each optical path. According to some embodiments an RF source 730 may be located off chip, so that the optical isolator includes an RF terminal 735 for receiving an RF drive signal. The RF terminal may connect to at least one of the RF phase modulators 220-1, 220-2 . . . 2220-N, 222-1, 222-2 . . . 222-N. If a single RF source is used, there may be RF amplitude and phase adjusters 733-1 . . . 733-P and/or 734-1, 734-2 . . . 734-N connected to the RF phase modulators. For example, a first optical path may include a first RF phase modulator 220-1 that receives a signal directly from an RF source 730 over conductive interconnects 740. A first RF adjuster 733-1 may be located at an input to, or be incorporated in the circuitry of, a second RF phase modulator 220-2 in a second optical path. The RF adjuster 733-1 may adjust the amplitude and/or phase of the RF signal provided to the second RF phase modulator 220-2, to impart a desired phase shift (~0.77π) to an optical signal traversing the phase modulator 220-2 and to skew the phase of the RF drive signal for the phase modulator 220-2 by a desired amount. An RF adjuster 733-1, 733-2, 733-P (where P is less than N), 734-1, 734-2, 734-N may comprise an RF amplifier and/or adjustable delay line. In some embodiments, RF adjusters may not be used. Instead, an optical isolator may comprise a plurality of RF terminals for receiving RF signals for each RF phase modulator.

In an optical isolator 700 that comprises N optical paths, the second RF phase modulators 222-1, 222-2 . . . 222-N may be driven by an RF signal that lags the phase of the RF signal provided to the first RF phase modulator 220-1, 220-2 . . . 220-N, respectively, in the optical path. The phase lag may be approximately π/2. Additionally the phases of the RF signals provided to each of the first RF phase modulators in the optical paths may be distributed evenly between 0 and 2π. For example, an RF drive signal provided to the first RF phase modulator of an $n^{th}$ optical path may be expressed as follows $$A\cos\left[2\pi\left(\mathrm{ft} + \frac{n-1}{N}\right)\right] \quad (5)$$

where $1 \le n \le N$, and N represents the total number of optical paths. According to EQ. 5, the relative phases of the first RF phase modulators are distributed evenly over 2π. The RF drive signal provided to the second RF phase modulator of the $n^{th}$ optical path may have a phase that lags that in EQ. 5 by approximately π/2.

Each pair of tandem RF phase modulators 220-N, 222-N may be separated by intermediate optical paths 252-N that each have a length L given by EQ. 1. In some embodiments, the waveguide group velocity $v_g$ for the intermediate optical paths may differ, so that the corresponding distances L may differ. The addition of optical paths between the splitter 710 and combiner 780 can improve the optical bandwidth of isolation, as described in U.S. patent application Ser. No. 13/733,111, published as U.S. Pat. Publication 2013-0209022-A1, which is incorporated herein by reference. As explained in connection with FIG. 2, the bypass optical path 260 provides an amount of optical signal that can be used to interfere with backward-travelling light resulting from residual amplitude modulation, and improve the optical isolation of the device.

Numerical simulations were carried out to model operation of an optical isolator 700. For this simulation, a design was chosen included four optical paths (N=4) and one bypass optical path 260. The optical paths were assumed to be lossless for purposes of the simulation. A continuous-wave optical signal including white noise was applied to the input port of the optical isolator 700. The RF drive frequency for the phase modulators was 10 GHz, and the phase relationships were as described above. Each RF phase modulator imparted a 0.77π phase shift to the optical signal.

Figure 8A:
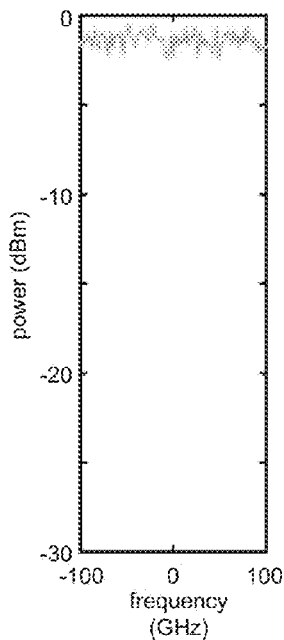
FIG. 8A, FIG. 8B, and FIG. 8C illustrate incident power, transmitted power, and reflected power, respectively, for an optical isolator, according to one embodiment.
Figure 8B:
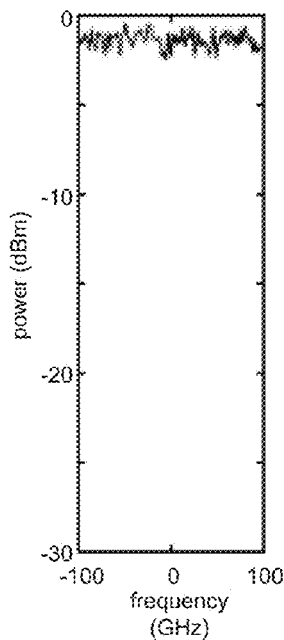
Figure 8C:
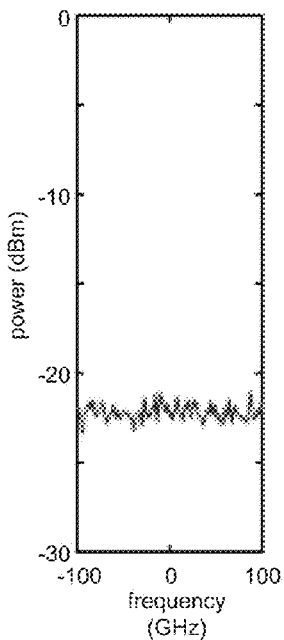

FIGS. 8A-8C depict incident, forward, and reverse optical power results, respectively, for an optical isolator. For this simulation, the RF phase modulators were assumed to be linear and not exhibit any residual amplitude modulation. Additionally, the optical isolator did not include a bypass optical path. FIG. 8A plots an amount optical power input to the optical isolator as a function of frequency. FIG. 8B plots the optical power passed through the isolator to the output. FIG. 8C plots and amount of power transmitted backwards through the optical isolator and measured at the input. FIG. 8C assumes that a same amount of power as applied at the input is applied at the output instead (e.g., all of the input power is reflected back through the isolator. For this first case, where no residual amplitude modulation occurs, the returned power is attenuated by approximately −22 dBm. Accordingly, the optical isolation is approximately 21 dB.

Figure 9A:
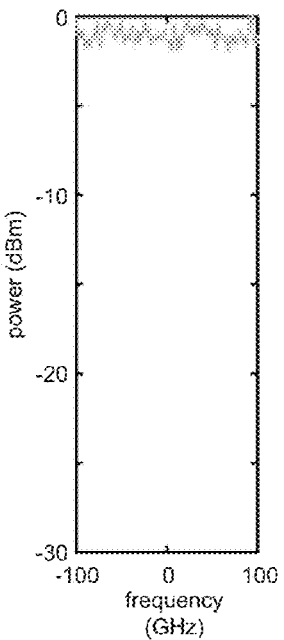
FIG. 9A, FIG. 9B, and FIG. 9C illustrate incident power, transmitted power, and reflected power, respectively, for an optical isolator, according to another embodiment.
Figure 9B:
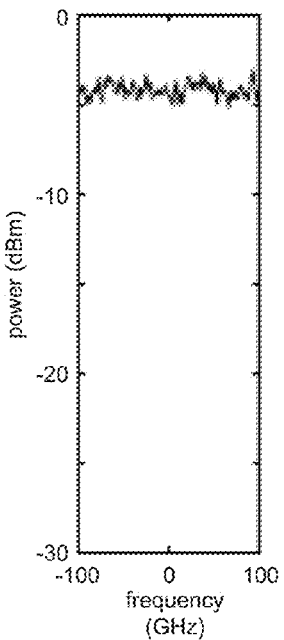
Figure 9C:
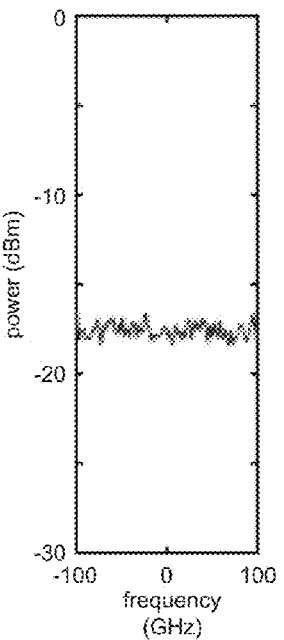

FIGS. 9A-9C depict incident, forward, and reverse optical power results, respectively, according to another embodiment. Namely, these figures depict a case in which the RF phase modulators imparted approximately 15% residual amplitude modulation. Also, the optical isolator did not include a bypass optical path. The amplitude modulation contributed to insertion loss of the isolator 700, which can be seen in FIG. 9B. The insertion loss is approximately 3 dB. Additionally, the residual amplitude modulation reduces the amount of optical isolation, as can be seen in FIG. 9C. The amount of back-reflected power is reduced to about −18 dBm. In comparison to the input power, the isolation is about 17 dB, of which 3 dB is attributed to insertion loss.

FIGS. 10A-10C depict incident, forward, and reverse optical power results, respectively, according to another embodiment. Namely, these figures illustrate a case in which the RF phase modulators impart 15% residual amplitude modulation to an optical signal in each optical path, and the optical isolator includes a bypass optical path 260 in which the phase and amplitude are tuned to reduce the total amount of backward-travelling light. The insertion loss increases slightly by about 1 dB. However, the addition of the bypass optical path provides further suppression of backward-travelling light, as can be seen in FIG. 10C. The backward-travelling light has been attenuated to approximately −25 dBm giving an isolation of approximately 24 dB, of which about 4 dB is due to insertion loss. The bypass optical path 260 can improve the optical isolation by at least 6 dB.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The invention claimed is:

1. An optical isolator comprising:
   an input port coupled to a splitter;
   an output port coupled to a combiner;
   N optical paths connecting the splitter and the combiner and each including two radio-frequency (RF) phase modulators, where N≥2 and the N optical paths contain no optical couplers; and
   a bypass optical path connecting the splitter and the combiner and lacking two active RF phase modulators.

2. The optical isolator of claim 1, wherein optical path lengths of the N optical paths and the bypass optical path between the splitter and the combiner are approximately equal.

3. The optical isolator of claim 1, wherein the splitter comprises a 1×(N+1) splitter of a photonics integrated circuit or a 1×(N+1) optical fiber splitter.

4. The optical isolator of claim 1, wherein the combiner comprises an (N+1)×1 combiner of a photonics integrated circuit or an (N+1)×1 optical fiber combiner.

5. The optical isolator of claim 1, wherein each of the N optical paths and bypass optical path comprises a silicon-photonics waveguide or optical fiber.

6. The optical isolator of claim 1, further comprising at least one radio-frequency source arranged to drive the radio-frequency phase modulators at a radio-frequency f.

7. The optical isolator of claim 6, wherein a distance L between a first pair of the two radio-frequency phase modulators in a first optical path of the N optical paths is approximately equal to $v_g/(4f)$, where $v_g$ is the group velocity of the first optical path between the first pair of radio-frequency phase modulators.

8. The optical isolator of claim 7, wherein a first radio-frequency phase modulator of the first pair is arranged to be driven with a first RF signal having a first phase and a second radio-frequency phase modulator of the first pair is arranged to be driven with a second RF signal having a second phase that lags the first phase by approximately $\pi/2$.

9. The optical isolator of claim 8, wherein a first radio-frequency phase modulator in each pair of tandem phase modulators in the N optical paths is configured to be driven with RF signals having different phases.

10. The optical isolator of claim 9, wherein the different phases are distributed evenly over $2\pi$.

11. The optical isolator of claim 1, further comprising a phase modulator in the bypass optical path.

12. The optical isolator of claim 1, further comprising an amplitude modulator in the bypass optical path.

13. The optical isolator of claim 1, wherein the radio-frequency phase modulators comprise a p-n junction containing multiple quantum wells formed in a waveguide.

14. The optical isolator of claim 13, wherein the p-n junction is asymmetric and the waveguide confines an optical mode travelling through the p-n junction to a region containing predominantly holes.

15. The optical isolator of claim 1, wherein the N optical paths and bypass optical path are configured to optically isolate the input port from the output port when the RF phase modulators are active.

16. A method to isolate an upstream optical source from an optical signal returned from a downstream optical system, the method comprising:
   receiving, at an optical isolator, an input optical signal from the optical source;
   splitting the input optical signal into N optical paths and a bypass optical path, where N≥2 and the N optical paths have no optical couplers;
   modulating phases of each optical signal in the N optical paths by a first RF signal and a second RF signal;
   transmitting a portion of the input optical signal from one end of the bypass optical path to an opposite end of the bypass optical path without performing radio-frequency modulation on the portion of the optical signal; and
   combining the optical signals from the N optical paths and the portion of the optical signal from the bypass optical path into an output signal, such that the input port is optically isolated from the output port.

17. The method of claim 16, wherein modulating phases of each optical signal in the N optical paths comprises:
   modulating a first radio-frequency phase modulator in a first optical path with the first RF signal having a first phase; and
   modulating a second radio-frequency phase modulator in the first optical path with the second RF signal having a second phase that lags the first phase by approximately $\pi/2$.

18. The method of claim 17, further comprising adjusting an amplitude of at least one of the radio-frequency phase modulators to increase optical isolation of the input port from the output port.

19. The method of claim 16, wherein modulating phases of each optical signal in the N optical paths comprises modulating a first radio-frequency phase modulator in a second optical path with the first RF signal having a third phase that is different from the first phase.

20. The method of claim 16, wherein modulating phases of each optical signal in the N optical paths comprises modulating a first radio-frequency phase modulator in each of the N optical paths with the RF signal having different phases distributed evenly over $2\pi$.

21. The method of claim 16, further comprising adjusting a phase of the portion of the optical signal in the bypass optical path to increase optical isolation of the input port from the output port.

22. The method of claim 16, further comprising adjusting an amplitude of the portion of the optical signal in the bypass optical path to increase optical isolation of the input port from the output port.

* * * * *